(12) United States Patent
Gupta et al.

(10) Patent No.: US 7,508,691 B2
(45) Date of Patent: Mar. 24, 2009

(54) MEMORY ARRANGEMENT WITH LOW POWER CONSUMPTION

(75) Inventors: Siddharth Gupta, Bangalore (IN); Yannick Martelloni, Poing (DE)

(73) Assignee: Infineon Technologies AG, Munich (DE)

( * ) Notice: Subject to any disclaimer, the term of this patent is extended or adjusted under 35 U.S.C. 154(b) by 138 days.

(21) Appl. No.: 11/259,573

(22) Filed: Oct. 26, 2005

(65) Prior Publication Data

US 2006/0120124 A1 Jun. 8, 2006

(30) Foreign Application Priority Data

Oct. 27, 2004 (DE) ........................ 10 2004 052 218

(51) Int. Cl.
*G11C 5/06* (2006.01)
(52) U.S. Cl. ..................... 365/63; 365/230.03; 365/226
(58) Field of Classification Search .................. 365/63, 365/230.03, 226
See application file for complete search history.

(56) References Cited

U.S. PATENT DOCUMENTS

| | | | |
|---|---|---|---|
| 4,402,065 A | 8/1983 | Taylor | |
| 4,698,750 A | 10/1987 | Wilkie et al. | |
| 4,701,886 A | 10/1987 | Sakakibara et al. | |
| 5,768,194 A | 6/1998 | Matsubara et al. | |
| 5,963,477 A * | 10/1999 | Hung | 365/185.22 |
| 6,535,437 B1 * | 3/2003 | Silver et al. | 365/200 |

FOREIGN PATENT DOCUMENTS

| | | |
|---|---|---|
| EP | 0 298 430 A2 | 1/1989 |
| EP | 0 373 672 A2 | 6/1990 |
| EP | 0 392 895 A2 | 10/1990 |

\* cited by examiner

*Primary Examiner*—Son Dinh
*Assistant Examiner*—Nam Nguyen
(74) *Attorney, Agent, or Firm*—Brinks Hofer Gilson & Lione

(57) ABSTRACT

A memory arrangement, particularly a ROM, having memory cells, local virtual supply voltage lines, word lines and result lines may also include global virtual supply voltage lines that run along the width of the memory arrangement parallel to the word lines. The local virtual supply voltage lines run parallel to the result lines, and perpendicularly to the word lines where the each local virtual supply voltage line runs only within a block of the memory arrangement. Each global virtual supply voltage line, in each block through which it runs, is connected to one local virtual supply voltage line. The coupling capacitance between the supply voltage lines and the result lines, and the inherent capacitance of the supply voltage lines are reduced, reducing the power consumption and increasing the clock frequency of the memory arrangement.

19 Claims, 3 Drawing Sheets

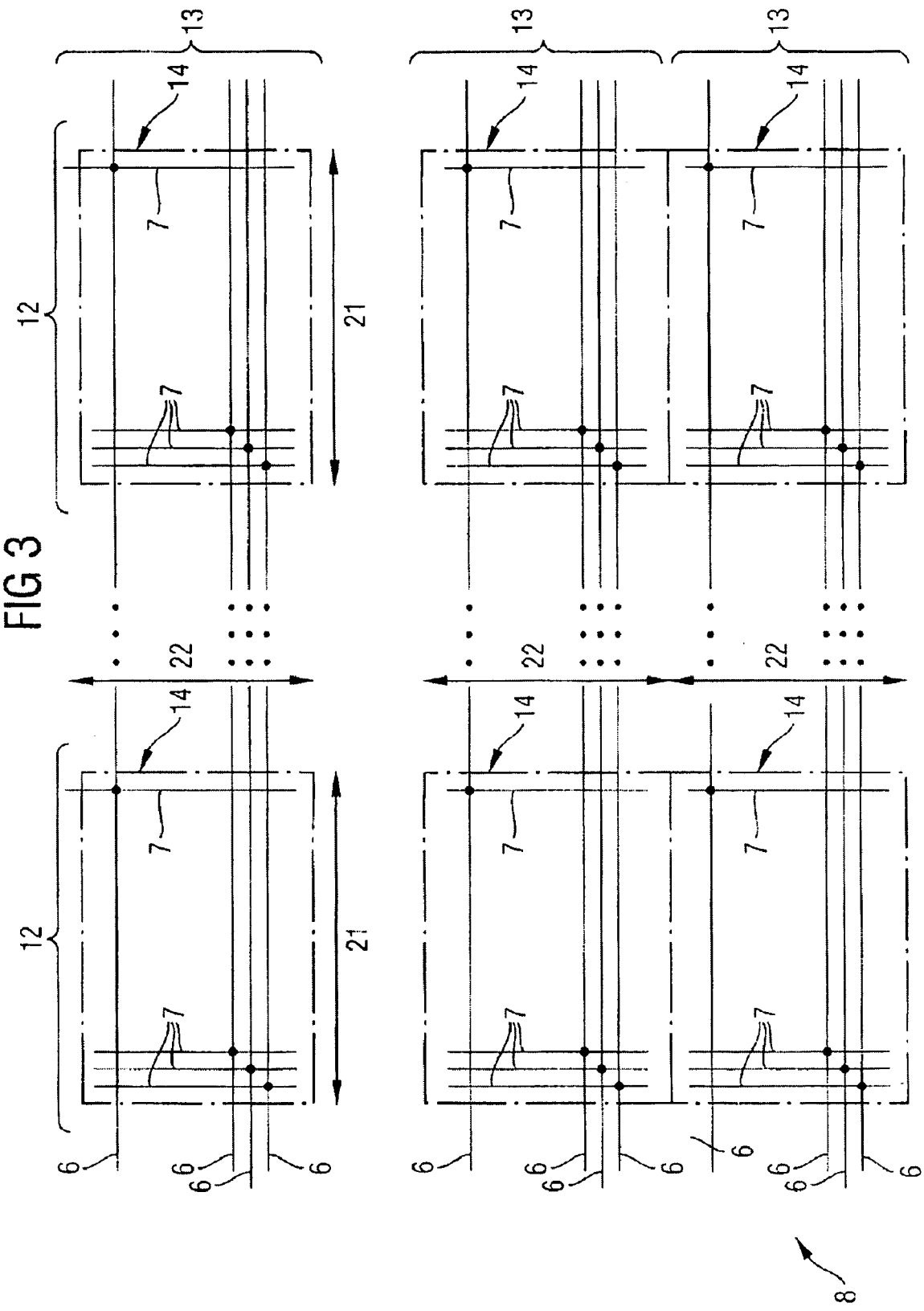

MEMORY ARRANGEMENT WITH LOW POWER CONSUMPTION

PRIORITY AND CROSS REFERENCE TO RELATED APPLICATION

This application claims priority to German Patent Application No. 10 2004 052 218.9, filed Oct. 27, 2004, which is incorporated by reference herein in its entirety.

BACKGROUND OF THE INVENTION

1. Field of the Invention

This invention relates to memory arrangements such as a read only memory ("ROM"), and in particularly to a memory arrangement having reduced power consumption.

2. Description of the Related Art

FIG. 1 illustrates a prior art read-only memory (ROM) 8 having many 1-bit memory cells, corresponding to the memory capacity of the ROM. These 1-bit memory cells are divided into various sections (also called block columns below) of equal size (equal number of 1-bit memory cells), depending on a word length of an output data item of the ROM. In each section, the 1-bit memory cells are arranged in columns and rows. A word line 3 of the ROM runs along the same row in all sections of the ROM. On the other hand, a virtual supply voltage line 1 and a bit line 2 run along a column in only one section of the ROM. This means that the virtual supply voltage lines 1 run parallel to the bit lines 2 along all memory cells which are arranged in a column.

In the case of traditional ROMs, a 1-bit memory cell which represents a logical "0" is usually constructed out of an NMOS transistor having a gate terminal connected to a word line 3, one of the source or drain terminals connected to a virtual supply voltage line 1, and the other terminal being connected to a bit line 2. There are several possibilities for constructing a 1-bit memory cell 4 that represents a logical "1". For instance, both the source and the drain terminals can be connected to the same bit line 2, or to the same virtual supply voltage line 1, or at least one of the two source and drain terminals hangs in the air, i.e. is connected neither to a bit line 1 nor to a virtual supply voltage line 1.

In the case of a ROM read operation, in which a data item for an address is read, starting from the address, one word line 3 and n (n corresponds to the word width, or number of bits, of the data item to be read) virtual supply voltage lines 1 are specified, and are then activated in the course of the read operation. The address is divided into a row address part and a column address part, the word line 3 being determined by means of the row address part and the virtual supply voltage lines 1 being determined by means of the column address part.

When a 1-bit memory cell 4 which represents a logical "0" is read, the following occurs: Whereas all bit lines 2 are on a first supply voltage potential before the read operation, the virtual supply voltage line 1 corresponding to the address and a bit position in the data item to be read are put or activated onto a second supply voltage potential only in the course of the read operation, and the word line 3 corresponding to the address is activated. In this way the NMOS transistor which represents the logical "0" becomes conducting, so that the bit line which is connected to the NMOS transistor is charged onto the second supply voltage potential. On the other hand, when a 1-bit memory cell 4 which represents a logical "1" is read, the NMOS transistor (if a transistor is present at all) becomes non-conducting, so that the bit line is not charged onto the second supply voltage potential.

For instance, the first supply voltage potential could be $V_{SS}$ and the second supply voltage potential could be $V_{DD}$, or conversely the first supply voltage potential could be $V_{DD}$ and the second supply voltage potential could be $V_{SS}$.

In FIG. 1, two sections or block columns 12 are shown. Result bit lines 5 of these two block columns 12 represent the least significant and most significant bits of the data item to be read from the ROM 8. The block columns between these two block columns 12 are only indicated in FIG. 1. Each result bit line 5 is the output of a multiplexer 11, in which case, in the context of a read operation, the bit line 2 corresponding to the address or column address part is switched to the output of the multiplexer 11.

Since, in the case of the ROM 8 according to the prior art, in a column 16 a virtual supply voltage line 1 runs parallel to a bit line 2 over the whole column length, the gap between the virtual supply voltage line 1 and the bit line 2 being extremely small because of the dimensions, which are becoming ever smaller, of the design techniques which are used today, the coupling capacitance or cross-coupling between the virtual supply voltage line 1 and the bit line 2 is great. Because of the coupling capacitance, the bit line 2 is also charged onto the second supply voltage potential if the virtual supply voltage line 1 is charged onto the second supply voltage potential in the course of a read operation. In the case of reading a logical "0", this is a positive effect, since the bit line 2 is charged onto the second supply voltage potential in the course of an operation to read a logical "0". On the other hand, in the case of reading a logical "1" it is a counter-productive effect, since the bit line 2 should remain on the first supply voltage potential in the course of an operation to read a logical "1". Therefore, when reading a logical "1", it is necessary to wait for a restoration period, until the bit line 2 is again at least near the first supply voltage potential, before the result bit line 5 which corresponds to the bit line 2 is evaluated. Since it is in the nature of the matter that before a read operation it is not known whether a logical "0" or a logical "1" is read, it is always necessary to wait for the restoration period, irrespective of whether a logical "0" or a logical "1" is read. Thus the restoration period decides a clock rate at which the ROM 8 can be read.

In addition to the negative effect on the clock rate of the ROM 8, the coupling capacitance has a negative effect on the power consumption of the ROM 8. Additionally, there is a negative effect on the power consumption by the inherent capacitance of each virtual supply voltage line 1, which must be charged onto the second supply voltage at a read operation. That is, the greater the coupling capacitance and/or the inherent capacitance is, the greater the power consumption that is necessary to charge the corresponding virtual supply voltage lines 1 onto the second supply voltage potential.

In the case of a ROM, in which words with a word width of n bits are stored, in the course of a read operation, n virtual supply voltage lines 1 must be charged onto the second supply voltage potential, and brought back to the first supply voltage potential after the evaluation of the result bit lines 5. Therefore, specifically in the case of ROMs with a large word width, the inherent capacitance and also the coupling capacitance are decisive for the power consumption and maximum clock frequency of the ROM.

Therefore it is desirable to provide a memory arrangement in which the coupling capacitance and inherent capacitance are as small as possible in the case of a read operation.

SUMMARY OF THE INVENTION

A memory arrangement (particularly a ROM), includes memory cells, supply voltage lines, word lines and result lines, where memory cells of the memory arrangement are connected to a supply voltage line, a result line and a word line. In the memory arrangement, a supply voltage line that is connected to a particular memory cell together with a result line is shorter than the result line, and/or is connected to fewer memory cells than the result line.

Because the supply voltage line is shorter than the result line, a coupling capacitance between the supply voltage line and the result line is less than if the supply voltage line was as long as the result line, as is in the prior art. Additionally, for the same reason, the inherent capacitance of the supply voltage line according to the invention is less than the inherent capacitance according to the prior art would be. By reducing the coupling capacitance, a restoration period, which allows the result line to again accept a different supply voltage potential from the supply voltage line, is also shortened. In this way, a switching time of the memory arrangement is also reduced, and a maximum clock rate of the memory arrangement is increased. Additionally, by reducing the coupling capacitance and inherent capacitance, a power consumption to charge the supply voltage line onto a supply voltage potential is reduced.

According to the invention, the memory cell is also capable of storing multiple bits. The memory cell also or alternatively may be a 1-bit memory cell that stores one bit. In the same way, according to the invention, the result line transports multiple bits. However, within the invention, the result line can also transport only one bit, so that in this case the result line corresponds to a bit line.

In the case of the memory arrangement according to the invention, according to a first embodiment, a 1-bit memory cell can be a transistor, particularly an NMOS transistor. A logical "0" can be implemented or stored by the NMOS transistor in that either the source terminal of the NMOS transistor is connected to one of the bit lines and the drain terminal of the NMOS transistor is connected to one of the supply voltage lines of the memory arrangement, or the source terminal of the NMOS transistor is connected to one of the supply voltage lines and the drain terminal of the NMOS transistor is connected to one of the bit lines of the memory arrangement. A logical "1" can be implemented or stored by the NMOS transistor in that either both the source terminal and the drain terminal of the NMOS transistor are connected to the same bit line or the same supply voltage line, or at least either the source terminal or the drain terminal of the NMOS transistor is connected to neither a bit line nor a supply voltage line.

In another embodiment, a logical "1" may be implemented using an NMOS transistor in that either the source terminal of the NMOS transistor is connected to one of the bit lines and the drain terminal of the NMOS transistor is connected to one of the supply voltage lines of the memory arrangement, or the source terminal of the NMOS transistor is connected to one of the supply voltage lines and the drain terminal of the NMOS transistor is connected to one of the bit lines of the memory arrangement. In this case, a logical "0" is implemented using a memory cell, in such a way that the memory cell never provides a conducting connection between the bit line and supply voltage line which are connected to the memory cell. This corresponds to how a logical "1" is implemented according to the first embodiment.

In the case of both embodiments, the gate terminal of an NMOS transistor is connected to a word line.

Additionally, it is also possible that a memory cell is not implemented using an NMOS transistor, but with a transistor of a different transistor type (e.g. a PMOS transistor or a bipolar transistor).

In particular, the memory arrangement according to the invention can also be in such a form that when a word line and a supply voltage line are activated simultaneously, two bits are read simultaneously. This is possible in that in each case two adjacent memory cells are connected to the appropriate activated word line and the appropriate activated supply voltage line. In each case, one of the two memory cells is connected to one of two bit lines, and the other of the two memory cells is connected to the other of the two bit lines.

Since by activating a word line and a supply voltage line, two bits are read simultaneously, an area of a memory arrangement can be reduced in comparison with an otherwise similar memory arrangement in which when a word line and a supply voltage line are activated only one bit is read.

According to the invention, it is possible that in the case of a first part of the memory arrangement, when a word line and a supply voltage line are activated two bits are read (i.e. two bit lines are evaluated), whereas in a second part of the memory arrangement, when a word line and a supply voltage line are activated only one bit is read (i.e. only one bit line is evaluated).

In particular, in the case of a memory arrangement according to the invention, another supply voltage line, which is connected to one or more supply voltage lines, can be present. In the course of a read operation, depending on an address for which a data item of the memory arrangement is to be read, a specified further supply voltage line, which is connected to a supply voltage line which is connected to a memory cell which is addressed by the address, is specified.

In particular, the supply voltage lines run parallel to the bit lines, and the further supply voltage lines run parallel to the word lines in the memory arrangement according to the invention. In particular, the supply voltage lines and bit lines run perpendicularly to the further supply voltage lines and word lines.

For a read operation, starting from the address, a word line, a further supply voltage line and, per bit of the data item to be read, a bit line, are determined or decoded.

This is a simplification, since in the case of prior ROM's one virtual supply voltage line per bit of the data item to be read is charged or activated, whereas according to the invention only one further supply voltage line in total is activated.

This invention is preferably suitable for use for programmable ROM arrangements. However, of course the invention is not restricted to this preferred application field, but can also be used for mask ROMs, erasable ROMs (EPROMs, EEPROMs) and RAMs.

DESCRIPTION OF THE DRAWINGS

This invention is explained in more detail below, with reference to the attached drawings and on the basis of preferred embodiments.

FIG. 3 shows schematically another ROM according to the invention, wherein a coupling according to the invention of supply voltage lines and further supply voltage lines is shown.

DESCRIPTION OF THE PREFERRED EMBODIMENTS

Figure 1:
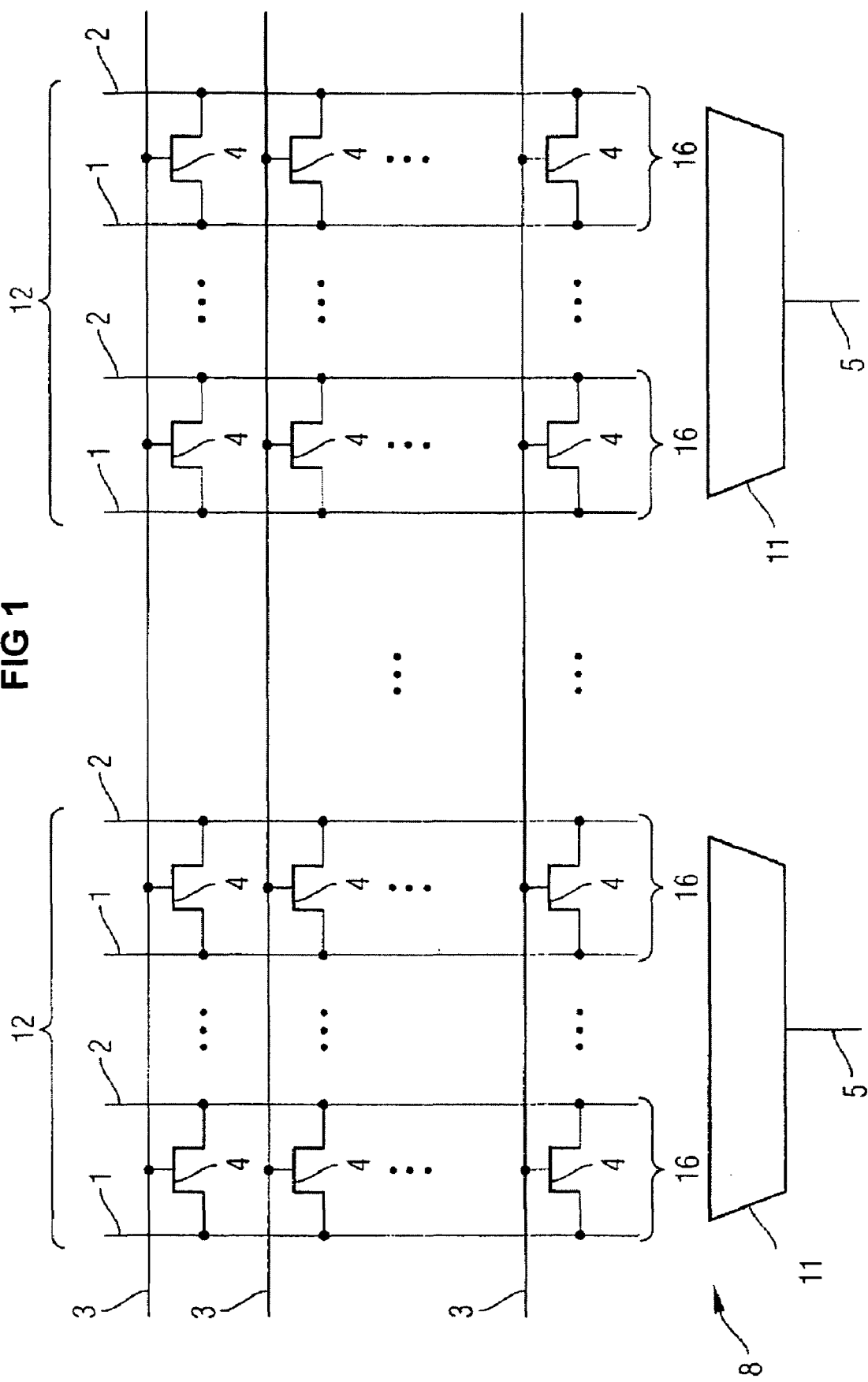
FIG. 1 shows schematically a ROM according to the prior art.

Identical or functionally identical elements and signals are referred to with the same reference symbols in the figures of the drawing unless stated otherwise.

Figure 2:
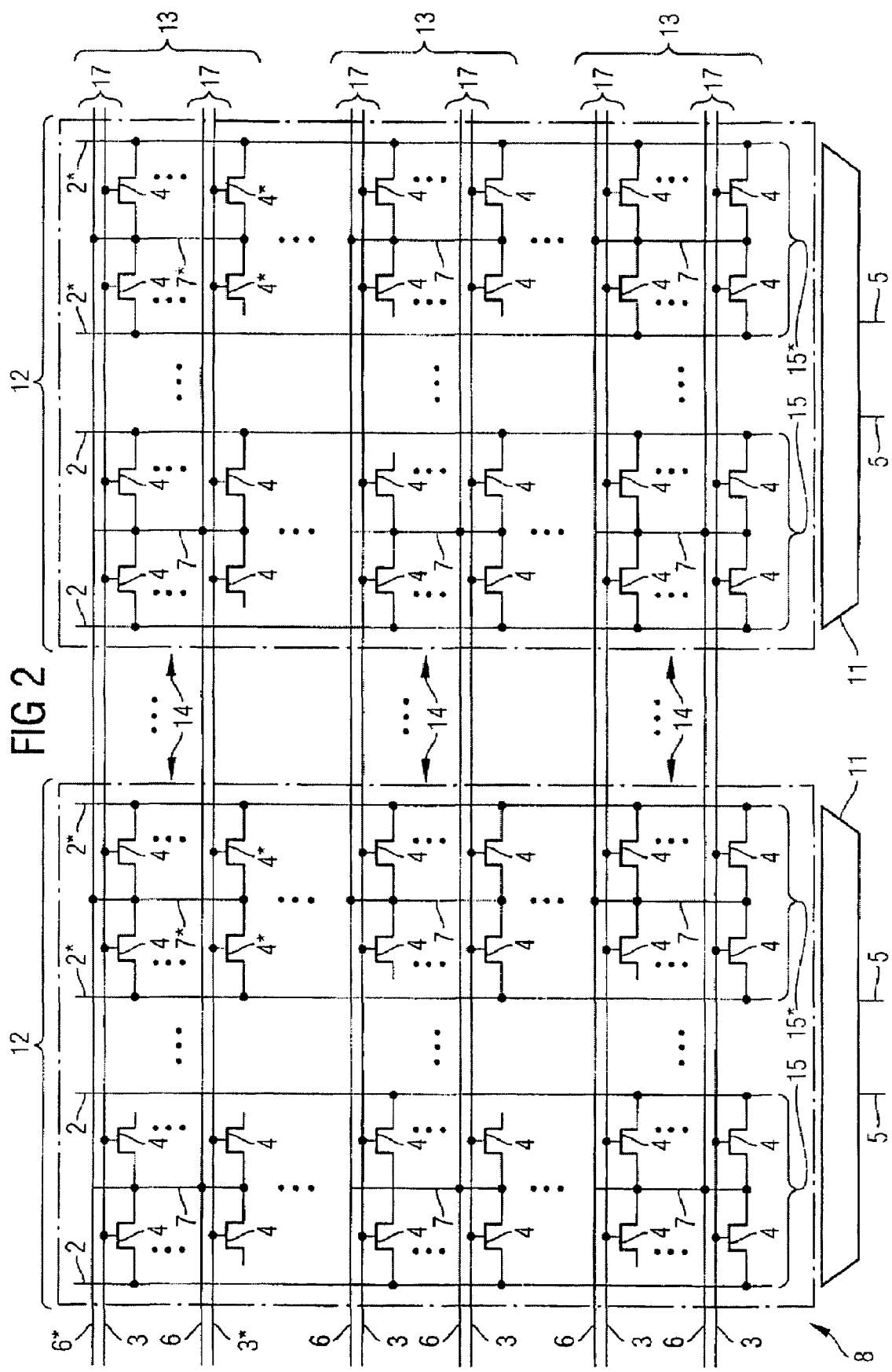
FIG. 2 shows schematically a ROM according to the invention, wherein when a word line and a supply voltage line are activated, two adjacent memory cells are activated.

In FIG. 2, a ROM 8 according to the invention, consisting of multiple blocks 14, is shown. A specified number of blocks 14 forms a block column 12, two of which are shown. Similarly, n/2 blocks form a block row 13, three of which are shown. The reference n stands for a word width of a data item which is read out of the ROM 8 in a read operation. Each word line 3 and also each further supply voltage line or global virtual supply voltage line 6 runs through the whole width of the ROM 8 or each double column 15 of the ROM 8. Each bit line 2 of the ROM 8 runs through the whole length of the ROM 8 or each row 17 of the ROM 8. On the other hand, each supply voltage line or local virtual supply voltage line 7 runs through only the length of a block 14 of the ROM 8. Each global virtual supply voltage line 6 is connected in each block column 12, e.g. via a via, to a local virtual supply voltage line 7. Conversely, each local virtual supply voltage line 7 is connected to a global virtual supply voltage line 6. Since each local virtual supply voltage line 7 is connected in each row to two memory cells 4, each block column 12 has two result bit lines 5 as output. On the output side, for each block column 12 a multiplexer 11, which switches two adjacent bit lines 2 onto the two result bit lines 5 depending on an address of the data item of the ROM 8 to be read, is arranged.

A result of the structure of the ROM 8 includes that for each block 14 a number of word lines 3 which run through the block is equal to a number of global virtual supply voltage lines 6 which also run through this block, equal to half a number of bit lines 2 which also run through this block, equal to a number of local virtual supply voltage lines 7 which also run through this block. In other words, a number of memory cells 4 per row 17 of a block 14 equals double a number of memory cells per double column 15 of a block 14.

To clarify how the ROM 8 functions, a read operation of the ROM 8 is described below. In the read operation, the data item, which consists of n bits, is read out depending on a specified address. Let it be assumed that at the start of the read operation all bit lines 2 are charged onto $V_{SS}$. Starting from the address, in a first step, the ROM 8 decodes a word line 3*, a global virtual supply voltage line 6* and, for each block column 12, two bit lines 2* or a double column 15*, this double column 15* (and thus the two bit lines 2*) being arranged equally relative to the relevant block column 12 (e.g., the last double column on the right in each block column 12). Via the decoded word line 3* and the decoded double column 15* or decoded bit lines 2*, in each block column 12 two 1-bit memory cells 4* are addressed. Additionally, in each decoded double column 15*, a local virtual supply voltage line 7* is connected to the decoded global virtual supply voltage line 6*, and is in turn connected to the appropriate two addressed 1-bit memory cells 4*.

To decode the word line 3*, the global virtual supply voltage line 6* and the two bit lines 2* or double column 15* per block column 12, as is usual according to the prior art, the address is divided into a column address part and a row address part. As in the case of the prior art, the word line 3* is determined by means of the row address part, and the two bit lines 2* or double column 15* per block column 12 are determined by means of the column address part. To decode the global virtual supply voltage line 6*, both the row address part and the column address part are used, so that via the decoded global virtual supply voltage line 6*, in each case, that local virtual supply voltage line 7* which is in the desired block row 13* and the appropriate double column 15* is addressed. It should be noted that in the chosen example, the decoded global virtual supply voltage line 6* is not directly next to the decoded word line 3*.

In a second step of the read operation, the decoded word line 3* is activated, and the decoded global virtual supply voltage line 6* is charged onto the supply voltage potential $V_{DD}$. In this way, also in each block column 12, the local virtual supply voltage line 7* in the block row 13* (corresponding to the address) of the decoded double column 15* is charged onto the supply voltage potential $V_{DD}$. If a logical "0" is stored in a memory cell which is addressed in the read operation, i.e. an NMOS transistor which is switched to conducting via the decoded word line 3* couples the corresponding local virtual supply voltage line 7* to the corresponding bit line 2*, the bit line 2*, which is connected to the memory cell 4*, is recharged onto the supply voltage potential VDD. On the other hand, if a logical "1" is stored in a memory cell 4* which is addressed in the read operation, the bit line 2*, which is connected to the memory cell 4*, is not recharged onto the supply voltage potential VDD via an NMOS transistor. However, each decoded bit line 2*, because of a coupling capacitance between the local virtual supply voltage line 7* and the decoded bit line 2* when the local virtual supply voltage line 7* is charged onto the supply voltage potential $V_{DD}$, is also pulled in the direction of $V_{DD}$. It is therefore necessary to wait for a restoration period until the decoded bit line 2* falls back to $V_{SS}$ before the corresponding result bit line 5 is evaluated.

However, since the local virtual supply voltage line 7 is significantly shorter than a virtual supply voltage line 1 (see FIG. 1) according to the prior art, the coupling capacitance between the local virtual supply voltage line 7 and the bit line 2 is significantly less than the coupling capacitance according to the prior art. The restoration period is therefore shorter, which results in advantages regarding the read time and clock frequency of the ROM 8 according to the invention. Thus, in the case of a ROM as described in FIG. 2, a total switching capacitance and with it also a dynamic power consumption of the ROM are significantly less than in the case of a ROM according to the prior art.

Finally in the read operation, the result bit lines 5, which are connected via the appropriate multiplexers 11 to the decoded bit lines 2*, are evaluated, to determine the data item which corresponds to the specified address. After this evaluation, the ROM 8 returns to a standby mode, in which all word lines 3, all bit lines 2 and all global virtual supply voltage lines 6, and thus all local virtual supply voltage lines 7, are charged onto $V_{SS}$. A new read operation then begins at the previously described first step.

Obviously, the distinguishing feature of standby mode could also be that all word lines 3, all bit lines 2 and all global virtual supply voltage lines 6, and thus all local virtual supply voltage lines 7, are charged onto $V_{DD}$, in which case PMOS transistors are usually used instead of NMOS transistors. In the case of a read operation, the decoded word line 3* and the decoded global virtual supply voltage line 6*, and thus the local virtual supply voltage lines 7* which are connected to it, would then be charged onto $V_{SS}$.

FIG. 3 illustrates a schematic diagram of an embodiment of a ROM 8 according to the invention. Compared with FIG. 2, fewer details are shown in FIG. 3. The difference between the ROMs shown in FIGS. 2 and 3 is that in the case of the ROM shown in FIG. 3, only one result bit line (not shown) exists for each block column 12. The ROM 8 shown in FIG. 3 consists of multiple blocks 14, each block 14 having a number of columns 21 (number of columns per block) and a number of rows 22 (number of rows per block). In other words, each block has a number of columns, and each column has a number of memory cells which is equal to the number of rows 22. That is, each block has a number of rows, and each row has a number of memory cells which is equal to the number of columns 21. The number of columns 21 equals the number of rows 22, which means that each block 14 has a number of memory cells which equals a product of the number of columns 21 and the number of rows 22 or equal to a square of the number of columns 21 or number of rows 22 (since number of columns=number of rows).

The blocks 14 are in turn arranged in block rows 13 and block columns 12. Each block column 12 has a result bit line (not shown), so that a number of block columns 12 equals the word width of a data item which can be read out of the ROM 8 shown in FIG. 3. Thus, a difference between the ROMs of FIGS. 2 and 3 is that in the ROM of FIG. 3, only one bit per block column 12 may be read out, whereas in the ROM shown of FIG. 2 two bits per block column 12 may be read out.

The connection between the global virtual supply voltage lines 6 and the local virtual supply voltage lines 7 is also illustrated in FIG. 3, where each global virtual supply voltage line 6, in each block 14 through which the global virtual supply voltage line 6 runs, is connected to the local virtual supply voltage line 7 which is arranged equally relative to this block 14. For instance, in each block row 13, the second global virtual supply voltage line 6 from the bottom is connected to the second local virtual supply voltage line 7 from the left in each block of this block row 13. Since each local virtual supply voltage line 7 supplies a column of a block 14 or memory cells that are arranged in a column of a block 14, for instance the second global virtual supply voltage line 6 from the bottom in the second block row 13 from the bottom (in FIG. 3) must be charged onto $V_{DD}$, if the result of decoding the address to be read is that a word line 3 in the second block row 13 from the bottom is to be activated, and in each block column 12 the second bit line from the left (not shown in FIG. 3) is to be evaluated.

By comparing the ROM 8 of FIG. 3 with the ROM 8 of FIG. 1, a further advantage of this invention can be explained. During a read operation, in the case of the ROM 8 shown in FIG. 1 according to the prior art, n (number of bits in the data item read from the ROM or number of block columns 12) virtual supply voltage lines 1 must be charged onto $V_{DD}$. On the other hand, in the case of the ROM of FIG. 3, only one global virtual supply voltage line 6 and n local virtual supply voltage lines 7 that are connected to it must be charged onto $V_{DD}$. Since the local virtual supply voltage lines 7 in FIG. 3 are significantly shorter than the virtual supply voltage lines 1 in the case of the ROM shown in FIG. 1 according to the prior art, a total length consisting of a global virtual supply voltage line 6 and the local virtual supply voltage lines 7 that are connected to it is shorter than a total length of n virtual supply voltage lines 1 in the case of a ROM shown in FIG. 1 according to the prior art. Therefore, the inherent capacitance in the case of the memory arrangement according to the invention, with reference to the global virtual supply voltage line 6 and the local virtual supply voltage lines 7 which are connected to it, is less than the inherent capacitance of the n virtual supply voltage lines 1 in the case of a ROM according to the prior art. The more block rows the corresponding ROM has, the greater is the difference between the inherent capacitances, or the advantage according to the invention.

Also, since the number of memory cells which are connected to local virtual supply voltage lines 7 which are connected to the same global virtual supply voltage line 6 is less than the number of memory cells which are connected to n virtual supply voltage lines 1 in the case of a ROM according to the prior art (see FIG. 1), in the case of a ROM according to the invention the load because of diffusion charging processes is less than in the case of a ROM according to the prior art. This pays for itself in a lower power consumption, and also offers the advantage of operating the ROM according to the invention with a higher clock frequency than a comparable ROM according to the prior art.

We claim:

1. A memory arrangement comprising:
a plurality of supply voltage lines;
a plurality of word lines;
a plurality of result lines;
a plurality of memory cells, each memory cell being connected to at least one of the supply voltage lines and at least one of the plurality of word lines;
each memory cell being permanently directly connected to at least one of the plurality of result lines, wherein each of the plurality of result lines provides a permanent electrical connection through the whole length of the memory arrangement; and
where at least one supply voltage line is connected to fewer memory cells than a result line of the memory cell with which the at least one supply voltage line is commonly connected.

2. The memory arrangement of claim 1, where the memory arrangement comprises a read-only memory (ROM).

3. The memory arrangement of claim 1, where each of the plurality of memory cells is a 1-bit memory cell, and each of the plurality of result lines is a bit line.

4. The memory arrangement of claim 3, where the 1-bit memory cell comprises a transistor having a control terminal being connected to a word line, and two other terminals each connected to a bit line and a supply voltage line.

5. The memory arrangement of claim 4, where the transistor comprises an NMOS transistor configured to store a logical "0" in a memory cell corresponding to the NMOS transistor according to the source terminal of the NMOS transistor being connected to one of the bit lines and the drain terminal of the NMOS transistor being connected to one of the supply voltage lines, and configured to store a logical "1" in a memory cell corresponding to the NMOS transistor according to a source terminal and a drain terminal of the NMOS transistor both being connected to the same bit line or both being connected to the same supply voltage line, or at least one of the two is not being connected.

6. The memory arrangement of claim 4, where the transistor comprises an NMOS transistor configured to store a logical "0" in a memory cell corresponding to the NMOS transistor according to the source terminal of the NMOS transistor being connected to one of the supply voltage lines and the drain terminal of the NMOS transistor being connected to one of the bit lines, and configured to store a logical "1" in a memory cell corresponding to the NMOS transistor according to a source terminal and a drain terminal of the NMOS transistor both being connected to the same bit line or both being connected to the same supply voltage line, or at least one of the two is not being connected.

7. The memory arrangement of claim 3, wherein before the word line connected to the memory cell and the supply voltage line connected to the memory cell are activated, the bit line connected to the memory cell is charged onto a first supply voltage, and the supply voltage line connected to the memory cell is activated by being charged onto a second supply voltage.

8. The memory arrangement of claim 1, comprising two memory cells being connected to the word line and the supply voltage line when a word line and a supply voltage line are activated, each of the two memory cells being connected to a result line, which accepts a value of the appropriate memory cell.

9. The memory arrangement of claim 1, comprising two adjacent memory cells being connected to a common word line and a common supply voltage line.

10. The memory arrangement of claim 1, comprising:
memory cells arranged in blocks, where each block includes a number of memory cells being arranged in a row equals a number of memory cells arranged in a double column;
a number of word lines in each block being equal to half the number of memory cells arranged in a double column;
a number of result lines in each block being equal to the number of memory cells arranged in a row; and
a number of supply voltage lines in each block being equal to half the number of memory cells arranged in a row,
where each supply voltage line is connected to as many memory cells in a block as correspond to the number of memory cells arranged in a double column, and to no memory cell of another block.

11. A memory arrangement comprising:
a plurality of supply voltage lines;
a plurality of word lines, including at least one further supply voltage line being permanently directly connected to at least one of the plurality of supply voltage lines;
a plurality of result lines;
a plurality of memory cells, each being connected to at least one of the supply voltage lines and at least one of the plurality of word lines;
each memory cell being directly connected to the at least one of the plurality of result lines, wherein each of the plurality of result lines provides a permanent electrical connection through the whole length of the memory arrangement; and
where at least one supply voltage line is connected to fewer memory cells than a result line of the memory cell with which the at least one supply voltage line is commonly connected.

12. The memory arrangement of claim 11, where a number of the word lines is equal to a number of the further supply voltage lines.

13. The memory arrangement of claim 11, where according to a memory cell being connected to an activated word line and a result line to be evaluated, a corresponding further supply voltage line being connected to a supply voltage line connected to the memory cell is activated.

14. The memory arrangement of claim 11, where the supply voltage lines and result lines are arranged substantially parallel, the further supply voltage lines and word lines are arranged substantially parallel, and the supply voltage lines and result lines are arranged substantially perpendicularly to the further supply voltage lines and word lines.

15. The memory arrangement of claims 11 where each further supply voltage line in each block through which it runs is connected to one of said supply voltage lines that is connected to memory cells of one of said columns, the column being arranged equally relative to the appropriate block in each block through which the further supply voltage line runs.

16. Memory arrangement of claim 11, where each further supply voltage line, in each block through which it runs, is connected to one of said supply voltage lines connected to memory cells of one of the double columns arranged equally relative to the appropriate block in each block through which the further supply voltage line runs.

17. A memory arrangement, comprising:
a plurality of memory cells, each memory cell being connected to at least one supply voltage line and at least one word lines, the memory cells being arranged in blocks, where in each block;
each memory cell being permanently directly connected to at least one result line;
a number of memory cells arranged in a column equals a number of memory cells arranged in a row, and a number of word lines in each block equals the number of memory cells arranged in a column, a number of result lines in each block is the same as a number of memory cells being arranged in a column, and a number of supply voltage lines in each block being the same as the number of memory cells arranged in a row;
a plurality of supply voltage lines, where at least one supply voltage line is connected to fewer memory cells than a result line of the memory cell with which the at least one supply voltage line is commonly connected, and where each supply voltage line is connected to as many memory cells in a block as corresponding to the number of memory cells being arranged in a column, and to no memory cell of another; and
wherein each of the plurality of result lines provides a permanent electrical connection through the whole length of the memory arrangement.

18. The memory arrangement of claim 17 where each further supply voltage line in each block through which it runs is connected to one of the supply voltage lines that is connected to memory cells of one of the columns being arranged equally relative to the appropriate block in each block through which the further supply voltage line runs.

19. A method for storing bits of data in a memory arrangement, having memory cells, supply voltage lines, word lines and result lines, comprising:
connecting a plurality of memory cells to at least one supply voltage line and at least one word line;
directly and permanently connecting the plurality of memory cells to at least one result line;
arranging the memory cells being in blocks, where in each block, a number of memory cells in a column equals a number of memory cells in a row, and a number of word lines in each block equals the number of memory cells in a column, a number of result lines in each block being the same as a number of memory cells arranged in a column, and a number of supply voltage lines in each block being the same as the number of memory cells arranged in a row;
connecting at least one supply voltage line to fewer memory cells than a result line of the memory cell with which the at least one supply voltage line is commonly connected, and where each supply voltage line is connected to as many memory cells in a block as corresponding to the number of memory cells being arranged in a column, and to no memory cell of another block; and
wherein each of the plurality of result lines provides a permanent electrical connection through the whole length of the memory arrangement.

* * * * *